United States Patent
Wu et al.

(10) Patent No.: US 7,291,885 B2
(45) Date of Patent: Nov. 6, 2007

(54) THIN FILM TRANSISTOR AND FABRICATION METHOD THEREOF

(75) Inventors: Chuan-Yi Wu, Taipei (TW);
Chin-Chuan Lai, Bade (TW);
Yung-Chia Kuan, Taipei (TW);
Wei-Jen Tai, Dongshih Township, Chiayi County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 92 days.

(21) Appl. No.: 11/214,677

(22) Filed: Aug. 29, 2005

(65) Prior Publication Data

US 2007/0045734 A1 Mar. 1, 2007

(51) Int. Cl.
*H01L 27/01* (2006.01)
(52) U.S. Cl. ............................ 257/347; 257/59; 257/72
(58) Field of Classification Search ................ 257/347, 257/59, 72; 438/158
See application file for complete search history.

(56) References Cited

U.S. PATENT DOCUMENTS 6,107,668 A * 8/2000 Ukita .......................... 257/412

* cited by examiner

*Primary Examiner*—Mark V. Prenty

(57) ABSTRACT

A thin film transistor is provided, including a substrate, a gate, a first dielectric layer, a channel layer, a source/drain and a second dielectric layer. The gate is disposed on the substrate, and the gate and the substrate are covered with the first dielectric layer. The channel layer is at least disposed on the first dielectric layer above the gate. The source/drain is disposed on the channel layer. The source/drain includes a first barrier layer, a conductive layer and a second barrier layer. The first barrier layer is disposed between the conductive layer and the channel layer. The conductive layer is covered with the first barrier layer and the second barrier layer. The source/drain is covered with the second dielectric layer. Accordingly, the variation of electric characters can be reduced. Moreover, a method for fabricating a thin film transistor is also provided.

6 Claims, 3 Drawing Sheets

THIN FILM TRANSISTOR AND FABRICATION METHOD THEREOF

BACKGROUND OF THE INVENTION

1. Field of Invention

The present invention relates to a method for making an active device, and particularly to a thin film transistor and a fabrication method thereof.

2. Description of Related Art

Nowadays, following the advancement of semiconductor devices and display apparatuses, the multi-media technology has been well developed. As to displays, the Thin Film Transistor Liquid Crystal Display (TFT-LCD), having the advantages of higher image quality, better space efficiency, lower power consumption, and zero radiation, is gradually becoming a mainstream product of the display market, and thin film transistors are widely used in TFT-LCDs.

FIG. 1 is a cross-sectional view of a conventional thin film transistor. Referring to FIG. 1, the conventional thin film transistor 100 comprises a substrate 110, a gate 120, a dielectric layer 130, a channel layer 140, an ohmic contact layer 142, a source/drain 150, and a dielectric layer 160. The gate 120 is disposed on the substrate 110. The dielectric layer 130 covers the gate 120. The channel layer 140 is disposed on a part of the dielectric layer 130 above the gate 120. The ohmic contact layer 142 is disposed on the channel layer 140. The source/drain 150 is disposed on the ohmic contact layer 142. And the dielectric layer 160 is disposed on the substrate 110, covering the source/drain 150.

In detail, the source/drain 150 is composed of a barrier layer 152, a conductor layer 154 and a barrier layer 156, wherein the barrier layer 152 is disposed between the conductor layer 154 and the ohmic contact layer 142 and the barrier layer 156 is disposed on the conductor layer 154. It should be noted that a part of the conductor layer 154 is exposed.

To produce such a source/drain 150, after an ohmic contact layer 142 is formed, a barrier layer 152, a conductor layer 154 and a barrier layer 156 are formed over the substrate 110 in sequence. Then, parts of the barrier layer 152, the conductor layer 154 and the barrier layer 156 are respectively etched, thus forming a source/drain 150. Finally, a part of the ohmic contact layer 142 is etched.

If the material of the conductor layer 154 is Cu or Ni, the etching equipments may be contaminated by the atoms of the conductor layer 154, during the process of etching the conductor layer 154. Moreover, the atoms of the conductor layer 154 may diffuse into the channel layer 140 during the process of forming the ohmic contact layer 142, adversely affecting the electric characters of the conventional thin film transistor 100.

SUMMARY OF THE INVENTION

In view of the above, an object of the present invention is to provide a thin film transistor having stable electric characters.

Another object of the present invention is to provide a method for making a thin film transistor having stable electric characters.

According to the above and other objects, a thin film transistor, comprising a substrate, a gate, a first dielectric layer, a channel layer, a source, a drain and a second dielectric layer, is provided. Herein, the gate is disposed on the substrate, and the gate and the substrate are covered by the first dielectric layer. The channel layer is disposed at least on a part of the first dielectric layer above the gate. The source/drain is disposed on the channel layer, wherein the source/drain comprises a first barrier layer, a first conductor layer, and a second barrier layer. The first barrier layer is disposed between the first conductor layer and the channel layer. The first conductor layer is enclosed by the first barrier layer and the second barrier layer, whereas the source/drain is covered by the second dielectric layer.

The above-described gate can further include a third barrier layer, a second conductor layer, and a fourth barrier layer. The third barrier layer is disposed on the substrate, and the second conductor layer is disposed on the third barrier layer. The fourth barrier layer covers the second conductor layer, and the third barrier layer and the fourth barrier layer enclose the second conductor layer. Moreover, the material for forming the third barrier layer and the fourth barrier layer can be Mo, Cr, Ti and Ta nitride, TiW alloy, metal silicide. The material for forming the second conductor layer can be Cu, Al, Au, Ag and Ni.

The above-described thin film transistor can further include an ohmic contact layer, which is disposed between the channel layer and the source/drain.

The material for forming the above-described first barrier layer and second barrier layer can be Mo, Cr, Ti and Ta nitride, TiW alloy, metal silicide.

The material for forming the above-described first conductor can be Cu, Al, Au, Ag and Ni.

For achieving the foregoing object and others, the present invention provides a method for making a thin film transistor, the method comprising first, providing a substrate and forming a gate thereon; then, forming a first dielectric layer to cover the gate; then, forming a channel layer at least on a part of the first dielectric layer above the gate, and forming a first barrier layer on the substrate to cover the channel layer; thereafter, forming a first conductor layer on the first barrier layer and then removing part of the first conductor layer; then forming a second barrier layer on the first conductor layer and part of the first barrier layer; then, removing a part of the second barrier layer to form a source/drain, wherein the first conductor layer is enclosed by the first barrier layer and the second barrier layer; finally, forming a second dielectric layer on the source/drain.

The forgoing method for forming a gate can include the steps of: first forming a third barrier layer on the substrate; then, forming a second conductor layer on the third barrier layer, wherein a part of the third barrier layer is exposed by the second conductor layer; finally, forming a fourth barrier layer on the third barrier layer to cover the second conductor layer.

The method for removing a part of the first conductor layer can be an etching process.

The method for removing a part of the second barrier layer can be an etching process.

After the above-mentioned channel layer is formed, an ohmic contact layer can be further formed on the channel layer. Furthermore, after the part of the first barrier layer and the part of the second barrier layer are removed, a part of the ohmic layer can also be removed. And the method for removing the part of the ohmic layer can be an etching process.

In view of the above, the present invention employs two barrier layers to cover the conductor layer, and then removes a part of the two barrier layers, forming a source/drain. As a result, the atoms of the conductor layer in the source/drain would not easily diffuse into the channel layer. In another word, the electric characters of the channel layer are relatively stable.

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 2A:
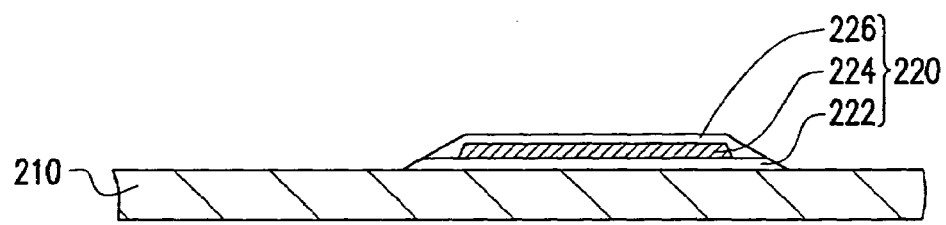
FIGS. 2A to 2E are flowcharts for schematically illustrating the process of making a thin film transistor according to the embodiment of the present invention.

FIGS. 2A to 2E are flowcharts for schematically illustrating the process of making a thin film transistor according to the embodiment of the present invention. Referring to FIG. 2A, the method of the present invention for making a thin film transistor includes the step of: first, providing a substrate 210 and forming a gate 220 thereon. In detail, the method for forming a gate 220 can be: first, providing a barrier layer 222 on the substrate 210; then, forming a conductor layer 224 on a part of the barrier layer 222; and then forming a barrier layer 226 on the barrier layer 222, wherein the barrier layers 222 and 226 substantially enclose the conductor layer 224. Herein, the method for forming the barrier layers 222 and 226 can be a physical vapor deposition (PVD) or chemical vapor deposition (CVD) process.

However, the structure of the gate 220 is not necessarily formed by the above-described process. For instance, the method for forming such a gate can also be: forming a barrier layer, a conductor layer and another barrier layer in sequence; and then etching the above structure to form a gate. The conductor layer of such a gate is exposed.

Figure 2B:
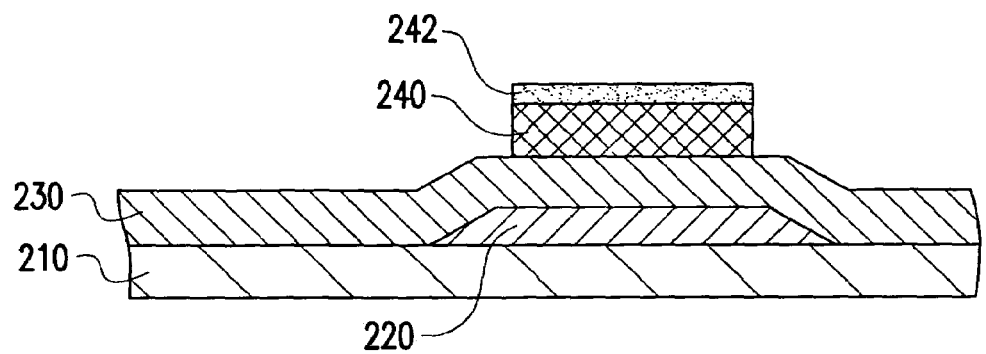

Referring to FIG. 2B, a dielectric layer 230 is formed on the substrate 210 to cover the gate 220 and substrate 210, wherein the method for forming the dielectric layer 230 can be a CVD process. Then a channel layer 240 is formed on a part of the dielectric layer 230 above the gate 220, wherein the method for forming the channel layer 240 can be a plasma enhanced chemical vapor deposition (PECVD) process. In the embodiment of the present invention, an ohmic contact layer 242 can be formed on the channel layer 240, for the purpose of decreasing the impedance of the channel layer 240. However, the ohmic contact layer 242 is not necessarily needed in the embodiment of the present invention.

Figure 2C:
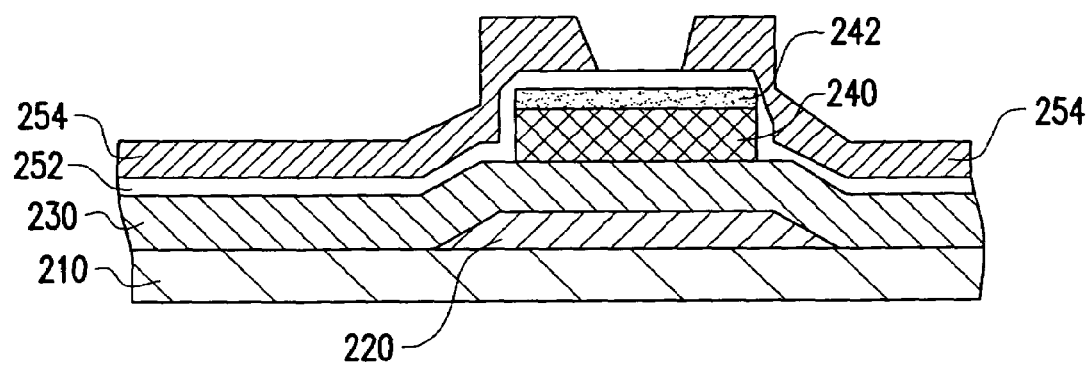

Referring to FIG. 2C, a barrier layer 252 is formed on the substrate 210 to cover the channel layer 240, the ohmic contact layer 242 and a part of the dielectric layer 230. And then a conductor layer 254 is formed on the barrier layer 252, wherein the method for forming the conductor layer 254 can be a CVD process. Thereafter, a part of the conductor layer 254 is removed, wherein the method for removing the part of the conductor layer 254 can be an etching process. It should be noted that the metal atoms of the conductor layer 254 would not easily diffuse into the channel layer 240 when removing a part of the conductor layer 254 because the barrier layer 252 covers the channel layer 240. In another words, the electric characters of such a channel layer 240 are relatively stable.

Figure 1:
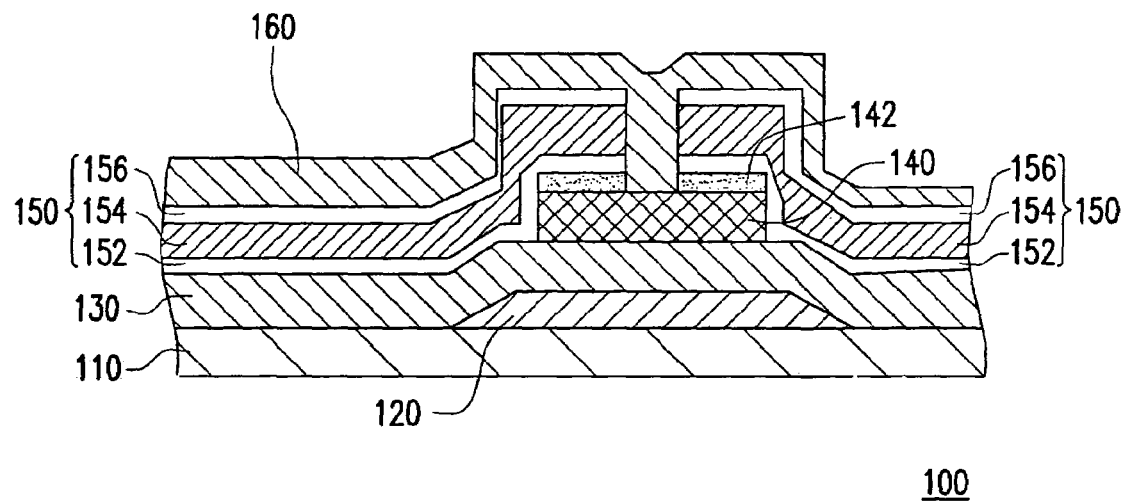
FIG. 1 is a cross-sectional view of a conventional thin film transistor.
Figure 2D:
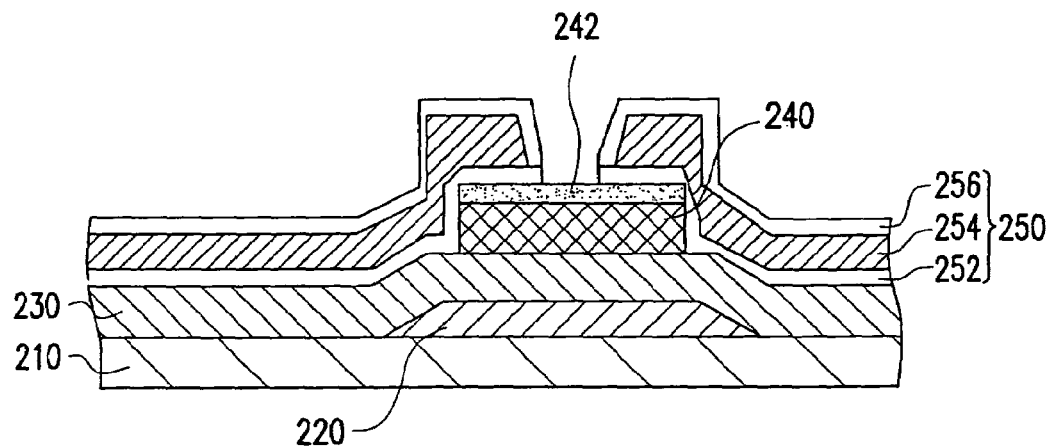

Referring to FIG. 2D, a barrier layer 256 is formed on the substrate 210 to cover the conductor layer 254 and a part of the barrier layer 252. The conductor layer 254 may have a taper structure, so that the barrier layer 256 may consequently have a desired staircase coverage effect. However, it should be noted that the conductor layer 254 can also be a right-angled structure (similar as that shown in FIG. 1) in the present invention. Thereafter, parts of the barrier layers 252 and 256 are removed and a source/drain 250 is therefore formed, wherein the conductor layer 254 is enclosed by the barrier layers 252 and 256. Furthermore, the method for removing parts of the barrier layers 252 and 256 can be an etching process.

Figure 2E:
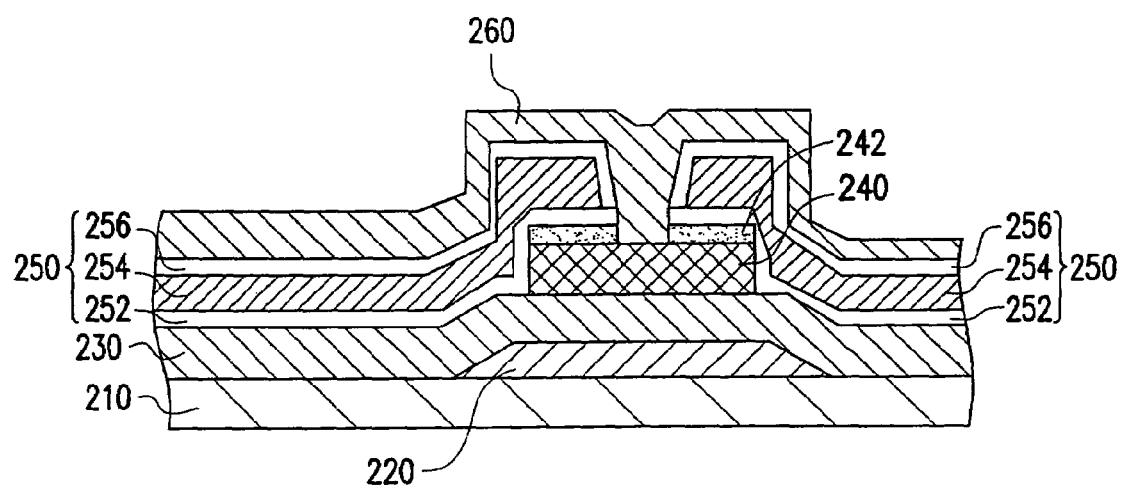

Referring to FIG. 2E, a part of the ohmic contact layer 242 is removed to expose a part of the channel layer 240, wherein the method for removing the part of the ohmic contact layer 242 can be an etching process or a reactive ion etching process. Because the conductor layer 254 is enclosed by the barrier layers 252 and 256, the condition of atoms of the conductor layer 254 contaminating the channel layer 240 can be improved during the process of removing the ohmic contact layer 242. After removing a part of the ohmic contact layer 242, a dielectric layer 260 is therefore formed on the substrate 210 to cover the source/drain 250. A thin film transistor 200 is then obtained according to the present invention. The structure of the thin film transistor 200 is discussed in detail below.

Also referring to FIG. 2E, the thin film transistor 200 comprises a substrate 210, a gate 220, a dielectric layer 230, a channel layer 240, an ohmic contact layer 242, a source/drain 250, and a dielectric layer 260. The gate 220 is disposed on the substrate 210. In this embodiment, the gate 220 includes a barrier layer 222, a conductor layer 224 and another barrier layer 226, wherein the barrier layer 222 is disposed on the substrate 210 and the conductor layer 224 is enclosed by the barrier layers 222 and 226. Further, the material for forming the barrier layers 222 and 226 can be selected from a group consisting of Mo, Cr, Ti and Ta nitride, TiW alloy, metal silicide. The material for forming the conductor layer 224 can be selected from a group consisting of Cu, Al, Au, Ag and Ni.

The gate 220 and substrate 210 are covered by a dielectric 230, wherein the material for forming the dielectric 230 can be selected from a group consisting of $SiN_x$, $SiO_x$, or $SiO_xN_y$. The channel layer 240 is disposed on a part of the dielectric layer 230 above the gate 220, wherein the material for forming the channel layer 240 can be amorphous Si. Moreover, the ohmic contact layer 242 is disposed between the channel layer 240 and the source/drain 250, wherein the material for forming the ohmic contact layer 242 can be doped amorphous silicon.

Although the source/drain 250 is disposed on the ohmic contact layer 242 as described in the embodiment, it can also be disposed on the channel layer 240. Furthermore, the source/drain 250 includes a barrier layer 252, a conductor layer 254 and another barrier layer 256, wherein the barrier layer 252 is disposed between the conductor layer 254 and the ohmic layer 242 and the conductor layer 254 is enclosed by the barrier layers 252 and 256. The material for forming the barrier layers 252 and 256 can be selected from a group consisting of Mo, Cr, Ti, and Ta nitride, TiW alloy, metal silicide and the material for forming the conductor layer 254 can be selected from a group consisting of Cu, Al, Au, Ag and Ni.

The source/drain 250 is covered by the dielectric layer 260, wherein the material for forming the dielectric 260 can be selected from a group consisting of $Si_3N_4$, $SiO_2$, SiON.

In view of the above, the thin film transistor and the method for making the same of the present invention have at least the following advantages:

1. Compared with the conventional technology, because the conductor layer of the source/drain of the thin film transistor in the present invention is enclosed by two barrier layers, the condition of atoms of the conductor layer of the source/drain contaminating the channel layer can be improved during the process of etching the ohmic contact layer, thereby enhancing the stability of the electric characters of the channel layer. In other words, the thin film transistor of the present invention has better electric characters than conventional ones; and 2. Compared with the conventional technology, the conductor layer of the source/drain of the thin film transistor in the present invention is enclosed by two barrier layers, thus the atoms of the conductor layer of the source/drain would not easily contaminate the processing equipments during the process of etching the ohmic contact layer.

It should be noted that specific embodiments of, and examples for, the invention are described herein for illustrative purposes, various equivalent modifications are possible within the scope of the invention, as those skilled in the relevant art will recognize that modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. A thin film transistor, comprising:
   a substrate;
   a gate, disposed on the substrate, wherein the gate comprises:
      a third barrier layer, disposed on the substrate;
      a second conductor layer, disposed on the third barrier layer; and
      a fourth barrier layer, covering the second conductor layer, wherein the second conductor layer is enclosed by the third barrier layer and the fourth barrier layer;
   a first dielectric layer, covering the gate and the substrate;
   a channel layer, disposed on at least a part of the first dielectric layer above the gate;
   a source/drain, disposed on the channel layer, the source/drain comprising a first barrier layer, a first conductor layer, and a second barrier layer, wherein the first barrier layer is disposed between the first conductor layer and the channel layer, and the first conductor layer is enclosed by the first barrier layer and the second barrier layer; and
   a second dielectric layer, covering the source/drain.

2. The thin film transistor according to claim 1, wherein the material for forming the third barrier layer and the fourth barrier layer is selected from a group consisting of Mo, Cr, Ti and Ta nitride, TiW alloy, metal silicide.

3. The thin film transistor according to claim 1, wherein the material for forming the second conductor layer is selected from a group consisting of Cu, Al, Au, Ag and Ni.

4. The thin film transistor according to claim 1, further comprising an ohmic contact layer, disposed between the channel layer and the source/drain.

5. The thin film transistor according to claim 1, wherein the material for forming the first barrier layer and the second barrier layer is selected from a group consisting of Mo, Cr, Ti and Ta nitride, TiW alloy, metal silicide.

6. The thin film transistor according to claim 1, wherein the material for forming the first conductor layer is selected from a group consisting of Cu, Al, Au, Ag and Ni.

* * * * *